United States Patent [19]
Shim

[11] Patent Number: 6,038,692
[45] Date of Patent: Mar. 14, 2000

[54] ERROR CORRECTING MEMORY SYSTEM

[75] Inventor: Jae-sung Shim, Seoul, Rep. of Korea

[73] Assignee: Samsung Electronics Co., Ltd., Kyungki-Do, Rep. of Korea

[21] Appl. No.: 08/184,446

[22] Filed: Jan. 21, 1994

[30] Foreign Application Priority Data

Jun. 28, 1993 [KR] Rep. of Korea ............... 93-11858

[51] Int. Cl.[7] ............................................. H03M 13/00
[52] U.S. Cl. ...................................................... 714/765
[58] Field of Search ............................ 371/40.3, 40.4, 371/37.2, 37.4, 37.5, 37.7, 50.1

[56] References Cited

U.S. PATENT DOCUMENTS 4,719,628  1/1988  Ozaki et al. ..................... 371/40.3

OTHER PUBLICATIONS

*Digital Communications*, Second Edition by John G. Proakis © 1989 by McGraw–Hill, Inc. pp. 440–442.

*Primary Examiner*—Phung M. Chung
*Attorney, Agent, or Firm*—Sughrue, Mion, Zinn Macpeak & Seas, PLLC

[57] ABSTRACT

An error correcting memory system, which writes and reads m-bit data and an error marking n-bit pointer by a predetermined rule, includes a first memory for m-bit data; a second memory for the n-bit pointer, an address generating unit for generating address signals for the first and second memories by a predetermined rule, and a writing/reading control signal generating unit for generating the respective writing and reading control signals of the first and second memories by receiving the writing and reading control signals and responding to a data/pointer differentiating signal. Therefore, the memory size of the error correcting memory system can be reduced.

13 Claims, 6 Drawing Sheets

ERROR CORRECTING MEMORY SYSTEM

FIELD OF THE INVENTION

The present invention relates to an error correcting memory system and, more particularly, to an error memory system for an optical disk player.

Korean Patent Application No. 93-11858 is incorporated herein by reference for all purposes.

BACKGROUND OF THE INVENTION

Generally, in order to improve the burst error correcting capability of an optical disk player at the time of reproduction, the recorded data is interleaved and recorded on a disk after encoding the error correction. When reproduction is desired, the data read from the disk is de-interleaved and reproduced after decoding the error correction. In such de-interleaving and error correction decoding processes, the data is written to or read from memory in a predetermined block unit of signal processing.

FIG. 1 shows a process for error correction decoding of a conventional optical disk player. The data read from the disk is first demodulated and is then de-interleaved by a predetermined rule in a first de-interleave block 10 so that a first error correction is achieved in C1 error correction block 12. Any data errors which are not corrected by the first error correction are marked with a pointer C1. After again de-interleaving the data following C1 error correction in a second de-interleave block 14 by a predetermined rule, a second error correction is performed in C2 error correction block 16. The data which is not corrected by the C2 error correction is marked with a pointer C2 and de-interleaved at a third de-interleave block 18 by a predetermined rule. Finally, the data is output. The aforementioned de-interleaving operations are performed by writing the input data into predetermined block units, mainly using a random access memory (RAM), and regulating the read addressing. Usually, the RAM is associated with an 8-bit data bus.

Referring to FIG. 2, the conventional error correcting memory device has an address generating unit 20 and an error correcting memory 40. The address generating unit 20 consists of a first offset address generator 22 for writing the eight-to-fourteen (EFM) demodulated data, a second offset address generator 24 for reading the decoder output data and the pointer, a third offset address generator 26 for writing and reading during the error correcting process, a multiplexer 28 for selecting the output from first through third offset address generators, a base counter 30 for counting the present base and an adder 32 for generating a final address signal by adding the outputs from the base counter 30 and the multiplexer 28. The error correcting memory 40 writes or reads data and pointers through the data bus in the process of error correction decoding. Accordingly, since the data input to or output from the error correcting memory 40 in the conventional device, consists of one byte, that is to say, an eight bit unit, while the pointer consists of one bit, the data which is not corrected is marked with a 1-bit pointer, thereby occupying two words (two bytes) of memory. Therefore, out of two byte space formed by one byte of 8-bit data and one byte of a 1-bit pointer, seven bits remain empty and unused, which means an unnecessary increase in RAM size.

The present invention was motivated by a desire to solve the existing problems noted in conventional error correcting memory devices

SUMMARY OF THE INVENTION

The principal object of the present invention is to provide an error correcting memory device for an effective use of the space thereof.

This and other objects, features and advantages according to the present invention are provided by an error correcting memory device including a first device for writing and reading m-bit data and an n-bit pointer for marking errors in accordance with a predetermined rule, where the first device advantageously includes:

a first memory for recording the m-bit data; a second memory for recording the n-bit pointer;

an address generating unit for generating the address signals of the first and second memories by a predetermined rule; and a writing/reading control signal generating unit for generating the respective writing and reading control signals of the first and second memories by receiving the writing and reading control signals and responding to a data/pointer differentiating signal.

This and other objects, features and advantages according to the present invention are provided by a second device in an error correcting memory device for writing and reading m-bit data and an n-bit pointer for marking errors in accordance with a predetermined rule. This second device preferably includes:

a memory whose capacity is m+n bits, for recording m-bit data and an n-bit pointer;

an address generating unit for generating an address signal of the memory by a predetermined rule; and a data bus driving unit for driving an m+n bit data bus of the memory bi-directionally by dividing m+n bit data into m-bits and n-bits in response to the data writing control signal and the pointer writing control signal.

These and other objects, features and advantages of the invention are disclosed in or apparent from the following description of preferred embodiments.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

Figure 1:
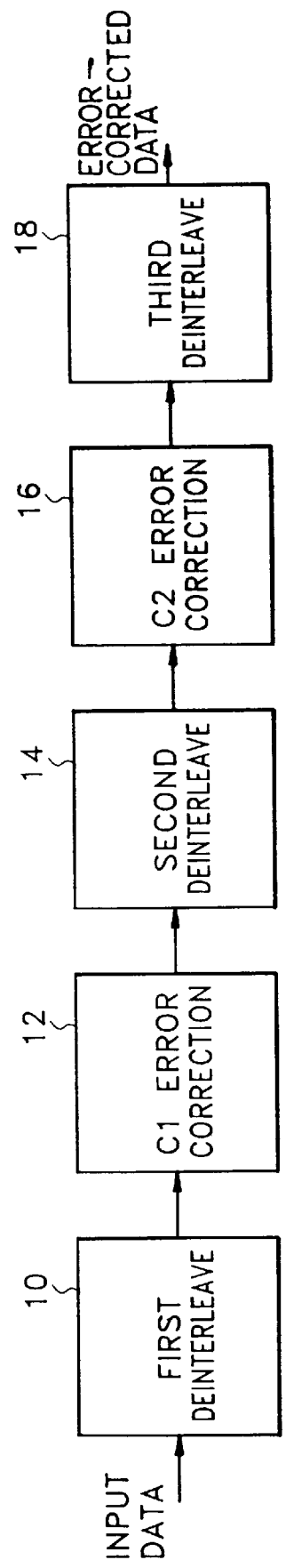
FIG. 1 is a block diagram showing an error correcting process performed by conventional optical disk player.
Figure 2:
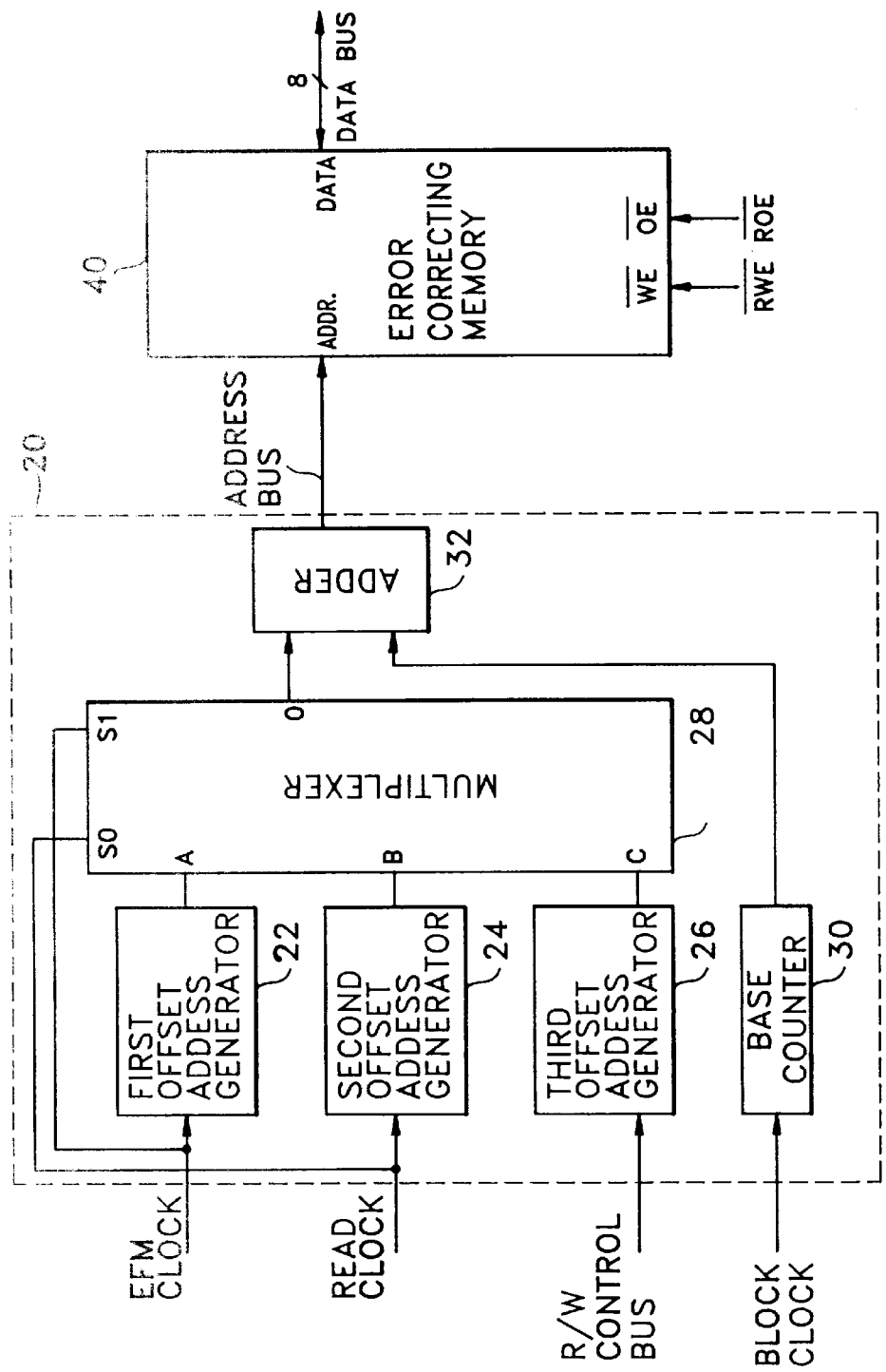
FIG. 2 is a block diagram of a conventional error correcting memory system.
Figure 3:
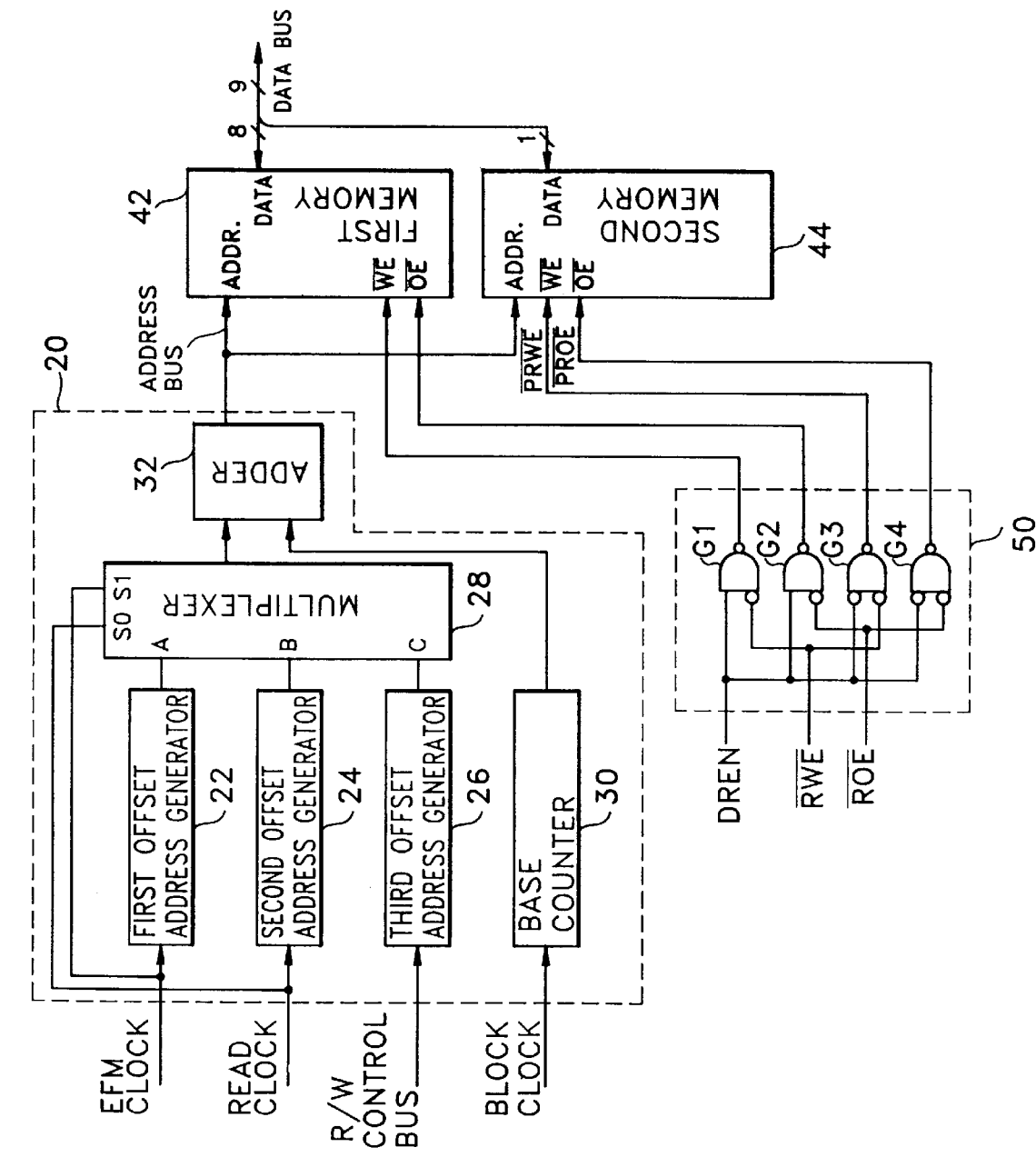
FIG. 3 is a block diagram of a preferred embodiment of error correcting memory system according to the present invention.

Referring to FIG. 3, which is a block diagram of a preferred embodiment of an error correcting memory system according to the present invention, the error correcting memory system includes a first memory, i.e., RAM, 42 for recording data and having an 8-bit data bus and a second memory, i.e., RAM, 44 for recording pointer and having a 1-bit data bus. A writing/reading control signal generator 50 controls the read/write operations of both first memory 42 and second memory 44, and an address generating unit 20, which is the same as the conventional one having first, second and third offset address generators 22, 24 and 26, multiplexer 28, base counter 30 and adder 32 are also included.

Figure 4:
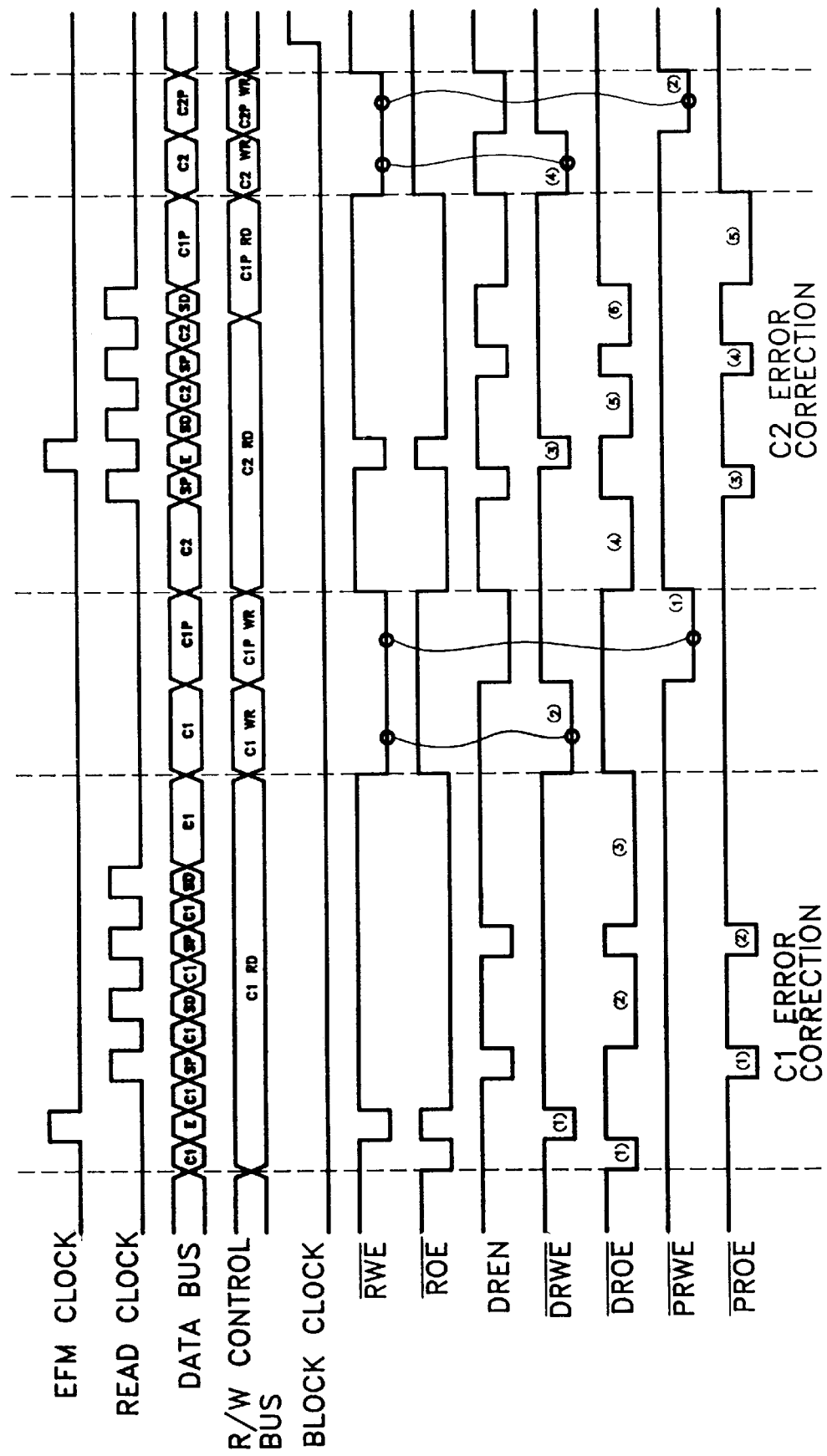
FIG. 4 shows various waveforms present in the various components of the system shown in FIG. 3 which waveforms are useful in explaining the operation of the system.

First offset address generator 22 receives an EFM clock for recording EFM data E (FIG. 4) and generates the offset address for recording EFM-demodulated data, which is supplied to input terminal A of multiplexer 28, so that the first de-interleave rule is satisfied. Second offset address generator 24 receives a read clock for reading the output data SD and pointer SP of the final decoder, as shown in FIG. 4, and generates the offset address for reading the output data and pointer of the decoder which is supplied to input terminal B of multiplexer 28, so as to satisfy the second de-interleave rule. Third offset address generator 26 receives a read/write control signal from R/W CONTROL BUS and generates the offset address for reading and writing the output data and pointer, which are necessary for error correction and which are supplied to input terminal C of multiplexer 28, so as to satisfy the third de-interleave rule.

Multiplexer 28 selects the input depending on the EFM clock signal and the read clock signal and outputs the selected input. In other words, inputs A, B and C are selected for the cases S0 and S1 being (0,1), (1,0) and (0,0), respectively. Base counter 30 supplies adder 32 with a clock indicating the base interval of decoding process and a block clock shown in FIG. 4 indicating the EFM frame synchronizing period. Adder 32 adds the outputs of multiplexer 28 and base counter 30, generates address signals for first memory 42 and second memory 44, and delivers them via the address bus.

Read/write control signal generator 50 having four NAND gates G1 through G4, receives write control signal $\overline{RWE}$ and read control signal $\overline{ROE}$ as shown in FIG. 4, outputs data writing signal $\overline{DRWE}$ and data reading control signal $\overline{DROE}$ with respect to the data of first memory of FIG. 4 according to a data/pointer differentiating signal DREN and delivers them to write control terminal $\overline{WE}$ and read control terminal $\overline{OE}$ of first memory 42. Also, read/write control signal generator 50 outputs a pointer write control signal $\overline{PRWE}$ and pointer read control signal $\overline{PROE}$ with respect to the pointer of second memory of FIG. 4 and delivers them to writing control terminal $\overline{WE}$ and reading control terminal $\overline{OE}$ of second memory 44.

The operation of one preferred embodiment of the present invention will now be described with reference to FIG. 4.

Referring to FIG. 4, data C1, E, C1, SP, C1, SD, C1, SP, C1, SD, C1, C1, C1P, C2, SP, E, SD, C2, SP, C2, SD, C1P, C2, C2P, . . . are applied to the data bus according to the EFM clock signal and the read clock signal which are input to offset address generating unit 20. Here, C1 is the read/write data of C1 error correction decoder, C1P is a read/write pointer C1, C2 is the read/write data of C2 error correction decoder, C2P is a C2 writing pointer, E is EFM recording data, SP is a final output pointer and SD is the final output data. First memory 42 reads data C1 at a low block of $\overline{DROE}$ (1) and writes data E at a low block of $\overline{DRWE}$ (1), and reads data C1, SD and C1 at low blocks of $\overline{DROE}$ (2) and (3). Here, data C1 is written at a low block of $\overline{DRWE}$ (2). Second memory 44 reads final pointer SP at low blocks of $\overline{PROE}$ (1) and (2) and writes pointer C1 by means of C1 error correction at a low block of $\overline{PRWE}$ (1). At the time of C2 error correction, first memory 42 reads data C2 at a low block of $\overline{DROE}$ (4) and writes data E at a low block of $\overline{DRWE}$ (3). Data SD and C2 are read at a low block of $\overline{DROE}$ (5) and data C2 and SD are read at a low block of $\overline{DROE}$ (6). The data which is corrected by C2 error correction is written a low block of $\overline{DRWE}$ (4). Second memory 44 reads data SP and C1P at low blocks of $\overline{PROE}$ (3), (4) and (5) and writes data C2P at a low block of $\overline{PRWE}$ (2).

In a preferred embodiment of the present invention as described above, the data is written in RAM 42 having an 8-bit data bus and the pointer is written in RAM 44 having a 1-bit data bus. Therefore, the unnecessary increase in RAM size can be avoided.

Figure 5:
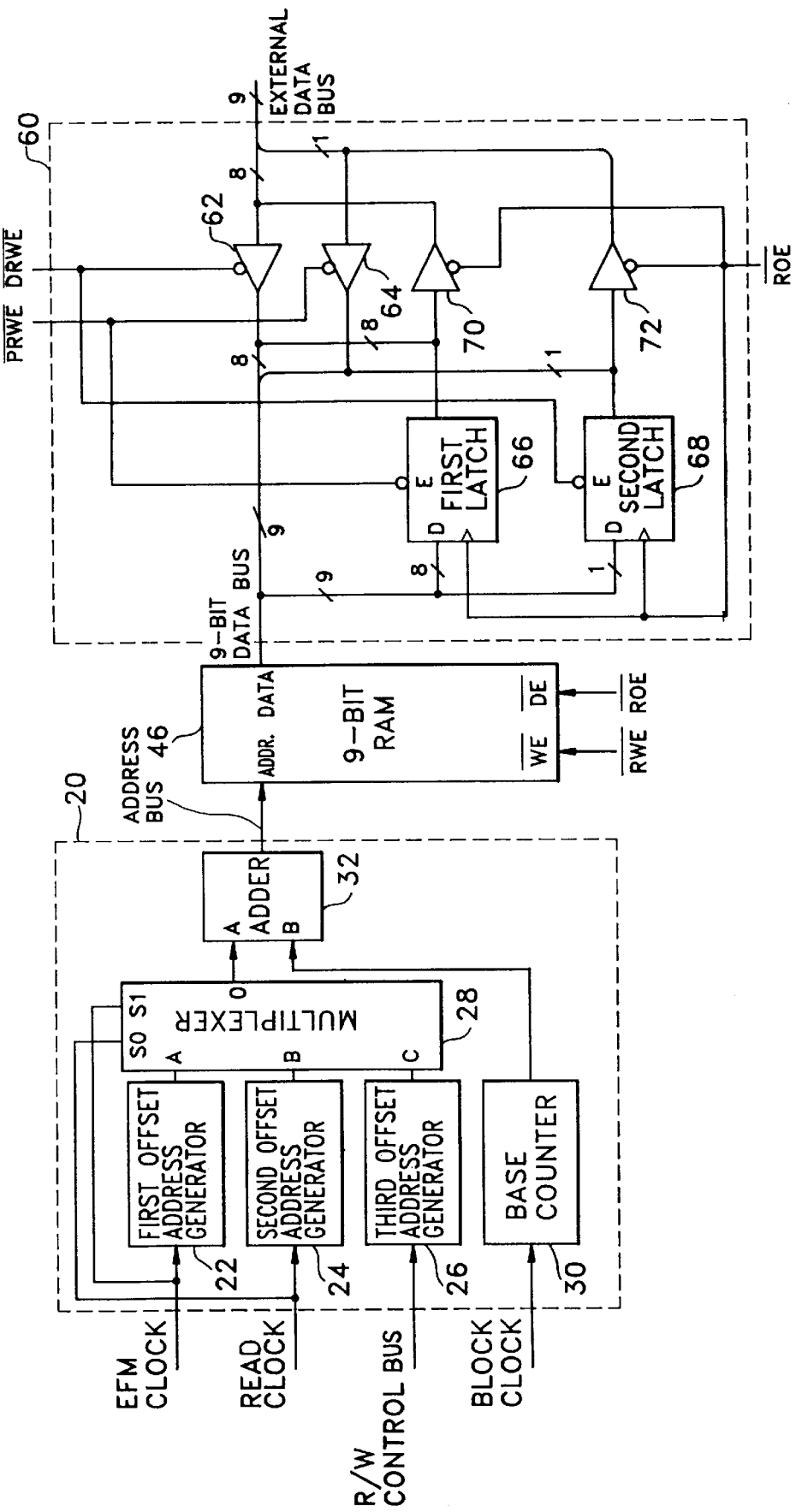
FIG. 5 is a block diagram of another preferred embodiment of error correcting memory system according to the present invention.

FIG. 5 is a block diagram of another preferred embodiment. This embodiment is different from the aforementioned embodiment in that a 9-bit RAM 46 is used and that a data bus driving unit 60 is provided for driving the data buses of the data and pointer, separately. Hereinafter, the mutually corresponding parts in two embodiments are designated by the same reference numerals. The 9-bit RAM 46 receives address signal from address generating unit 20 through the address bus and receives writing control signal $\overline{RWE}$ and reading control signal $\overline{ROE}$ as the control signals. Data bus driving unit 60 comprises a first writing bus driver 62 for driving an 8-bit data bus depending on the data write control signal $\overline{DRWE}$ and a second writing bus driver 64 for driving a 1-bit pointer bus depending on pointer write control signal $\overline{PRWE}$. Preferably, data bus driving unit 60 comprises a first latch 66 for latching 8-bit data read from the memory by being enabled by the data writing control signal $\overline{DRWE}$ and synchronized with reading control signal $\overline{ROE}$, a second latch 68 for latching the 1-bit pointer read from the memory by being enabled by the pointer write control signal $\overline{PRWE}$ and being synchronized with reading control signal $\overline{ROE}$, a first reading bus driver 70 for driving the 8-bit data bus depending on the reading control $\overline{ROE}$ and a second reading bus driver 72 for driving the 1-bit pointer bus depending on the reading control signal $\overline{ROE}$.

Figure 6:
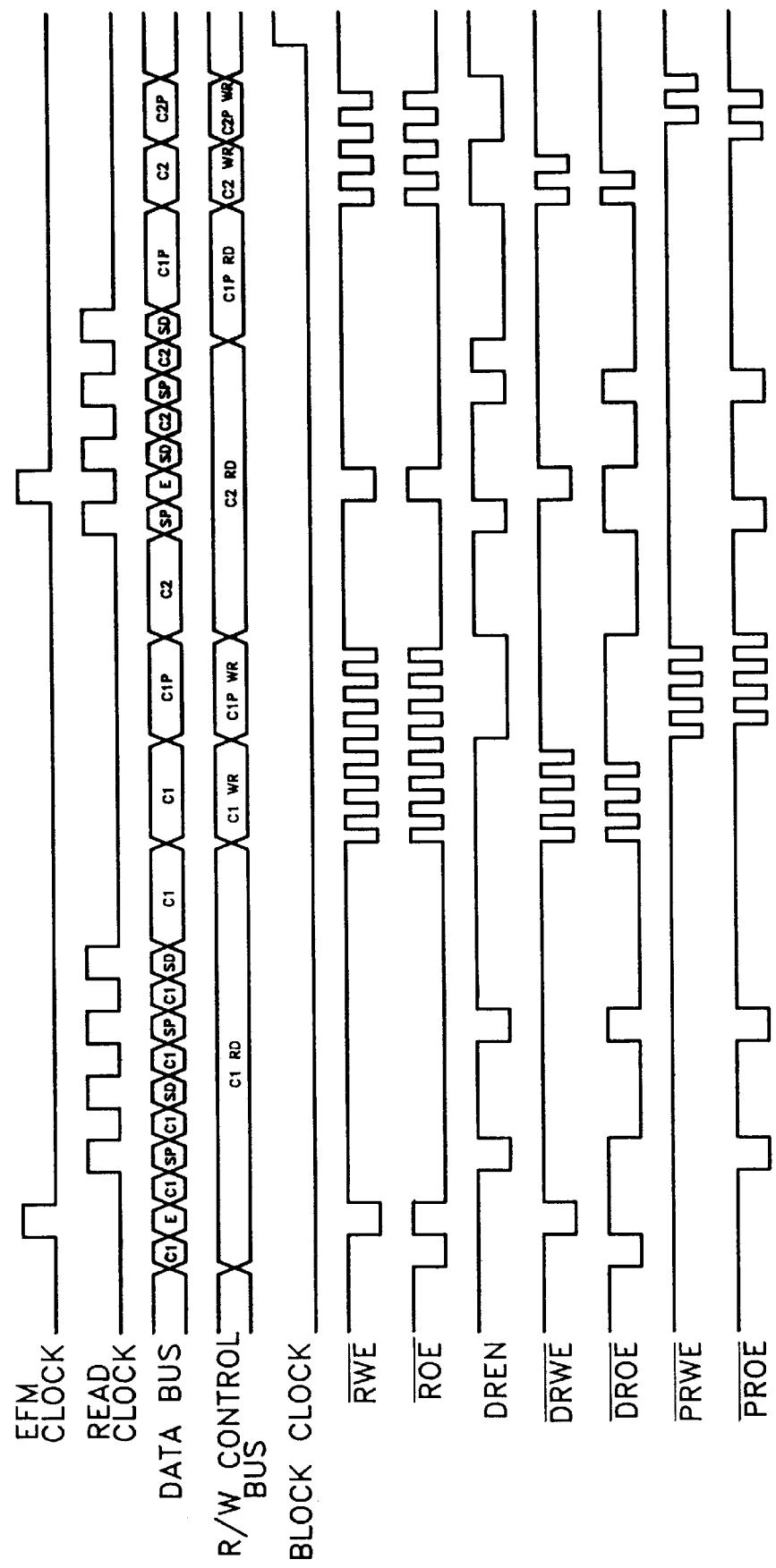
FIG. 6 shows various waveforms present in the various components of the system shown in FIG. 5 which are useful in explaining the operation of that system.

The operation of another preferred embodiment according to the present invention will now be described with reference to FIG. 6. The signal passes from the 9-bit data bus to the external data bus at a low block of $\overline{ROE}$. At the time of data recording, after the reading control signal $\overline{ROE}$ is activated to be a "low" block signal, the 8-bit data and 1-bit pointer are stored temporarily in latches 66 and 68 at the rising edge of $\overline{ROE}$. Thereafter, $\overline{DRWE}$ signal is activated to be a "low" block signal and 8-bit data of the external data and the data bus of the 1-bit pointer read from the memory are read from latch 68 and written in 9-bit RAM 46 at a low block of $\overline{RWE}$ through the 9-bit data bus. When the pointer is intended to be written in 9-bit RAM 46, the $\overline{ROE}$ signal is activated to be a "low" block signal and the 8-bit data and 1-bit pointer are temporarily stored in latches 66 and 68 at the rising edge. Then, by activating $\overline{PRWE}$ signal to be a "low" block signal immediately, the 1-bit pointer of the external data bus and the 8-bit data of the 9-bit data bus read from latch 66 are written in 9-bit RAM 46 as the write control signal through the 9-bit data bus at a "low" block of $\overline{RWE}$.

Therefore, according to another preferred embodiment of the present invention, since 8-bit data and the 1-bit pointer can be written in a memory having a 9-bit data bus in one word, the unnecessary increase in memory size may be avoided.

According to the present invention, as described above, the memory space to be used in an error correcting system of an optical disk player can be utilized efficiently and thereby reduce memory size. Thus, the integration of an error correcting system in one chip is simplified while the cost is greatly reduced.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. An error correcting memory system which writes and reads m-bit data and an error marking n-bit pointer by a predetermined rule, comprising:

a first memory for recording said m-bit data;

a second memory for recording said n-bit pointer;

an address generating unit for generating the address signals of said first and second memories by a predetermined rule; and a writing/reading control signal generating unit for generating the respective writing and reading control signals of said first and second memories by receiving the writing and reading control signals and responding to a data/pointer differentiating signal, wherein m and n are integers greater than or equal to one.

2. An error correcting memory system as claimed in claim 1, wherein said m-bit data includes eight bits, wherein said n-bit error marking pointer includes one bit, wherein said first memory is a first RAM storing 8-bit words and wherein said second memory is a second RAM storing 1-bit words.

3. An error correcting memory system which writes and reads m-bit data and an n-bit error marking pointer by a predetermined rule, comprising:

a memory whose capacity is m+n bits for recording said m-bit data and said n-bit pointer;

an address generating unit for generating an address signal of the memory by a predetermined rule; and a data bus driving unit for driving an m+n bit data bus operatively connected to said memory bi-directionally by dividing said m+n bit data into m-bits and n-bits in response to a data input control signal and a pointer writing control signal, where m and n are integers greater than or equal to one.

4. An error correcting memory system as claimed in claim 3, wherein an internal data bus connects said memory to said data bus driving unit, wherein said data bus driving unit is coupled to an external data bus, and wherein said data input control signal comprises a data writing control signal and a data reading control signal.

5. An error correcting memory system as claimed in claim 4, wherein said data bus driving unit comprises:

a first writing bus driver for combining said m-bit data received from said external data bus to the internal data bus in accordance with the data writing control signal;

a second writing bus driver for combining said n-bit pointer from the external pointer bus to the internal pointer bus in accordance with the pointer writing control signal;

first latch for latching said m-bit data, being enabled by said data writing control signal and synchronized by the reading control signal and thereby read via said internal data bus;

second latch for latching said n-bit pointer, being enabled by said pointer writing control signal and synchronized by said reading control signal and thereby being read via said internal pointer bus;

a first reading bus driver for combining said m-bit internal data bus and said external data bus in accordance with said reading control signal; and a second reading bus driver for combining said n-bit internal pointer bus and said external pointer bus in accordance with said reading control signal.

6. An error correcting memory system having an address generating unit for generating address signals by a predetermined rule so as to permit said system to write and read m-bit data and an error marking n-bit pointer by the predetermined rule, wherein m and n are integers greater than or equal to 1, said system comprising a memory characterized in that said memory selectively reads and writes said m-bit data and said n-bit pointer responsive to said address signals, a first control signal, a second control signal and a pointer control signal.

7. The error correcting memory system as claimed in claim 6, wherein said memory comprises:

a first memory storing said m-bit data;

a second memory storing said n-bit pointer; and a writing/reading control signal generating unit for generating respective writing and reading memory control signals for said first and second memories in response to said first control signal, said second control signal and said pointer control signal.

8. The error correcting memory system as claimed in claim 7, wherein said first control signal is a writing control signal, wherein said second control signal is a reading control signal and wherein said pointer control signal is a data/pointer differentiating signal.

9. The error correcting memory system as claimed in claim 7, wherein said m-bit data includes eight bits, wherein said n-bit pointer includes one bit, wherein said first memory is a first RAM storing 8-bit words and wherein said second memory is a second RAM storing 1-bit words.

10. The error correcting memory system as claimed in claim 6, said memory further comprising:

a m+n bit memory storing words whose length is m+n bits; and a data bus driving unit for driving an m+n bit data bus operatively connected to said m+n bit memory bi-directionally by dividing said m+n bit data into m-bits and n-bits in response to said first control signal, said second control signal and said pointer control signal.

11. The error correcting memory system as claimed in claim 10, wherein said first control signal corresponds to a data writing control signal, wherein said second control signal corresponds to a reading control signal and wherein said pointer control signal corresponds to a pointer writing control signal.

12. The error correcting memory system as claimed in claim 11, wherein an internal data bus connects said m+n bit memory to said data bus driving unit, and wherein said data bus driving unit is coupled to an external data bus.

13. The error correcting memory system as claimed in claim 12, wherein said data bus driving unit comprises:

a first writing bus driver for combining said m-bit data received from said external data bus to the internal data bus in accordance with said data writing control signal;

a second writing bus driver for combining said n-bit pointer from the external pointer bus to the internal pointer bus in accordance with the pointer writing control signal;

first latch for latching said m-bit data enabled by said data writing control signal and synchronized by the reading control signal and thereby read via said internal data bus;

second latch for latching said n-bit pointer enabled by said pointer writing control signal and synchronized by said reading control signal and thereby being read via said internal pointer bus;

a first reading bus driver for connecting said m-bit internal data bus and said external data bus in accordance with said reading control signal; and a second reading bus driver for coupling said n-bit internal pointer bus and said external pointer bus in accordance with said reading control signal.

* * * * *